United States Patent
Yang

(10) Patent No.: US 8,422,323 B2
(45) Date of Patent: Apr. 16, 2013

(54) MULTI-BIT TEST CIRCUIT OF SEMICONDUCTOR MEMORY APPARATUS

(75) Inventor: Sun Suk Yang, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 140 days.

(21) Appl. No.: 12/966,650

(22) Filed: Dec. 13, 2010

(65) Prior Publication Data

US 2012/0026809 A1 Feb. 2, 2012

(30) Foreign Application Priority Data

Jul. 30, 2010 (KR) ........................ 10-2010-0074022

(51) Int. Cl.
*G11C 29/00* (2006.01)
*G11C 7/00* (2006.01)
*G11C 8/00* (2006.01)

(52) U.S. Cl.
USPC ....... 365/201; 365/191; 365/194; 365/230.03

(58) Field of Classification Search .................. 365/201
See application file for complete search history.

(56) References Cited

U.S. PATENT DOCUMENTS

| 5,548,596 | A | * | 8/1996 | Tobita .......................... 714/719 |
| 5,973,990 | A | * | 10/1999 | Sakurai ...................... 365/233.1 |
| 6,003,148 | A | * | 12/1999 | Yamauchi et al. ............ 714/711 |
| 6,490,222 | B2 | * | 12/2002 | Choi et al. .................... 365/201 |
| 7,154,808 | B2 | * | 12/2006 | Shim ....................... 365/230.04 |
| 7,187,195 | B2 | * | 3/2007 | Kim ................................ 326/16 |
| 7,466,612 | B2 | * | 12/2008 | Shim ............................. 365/201 |
| 7,626,875 | B2 | | 12/2009 | Han et al. |
| 7,830,741 | B2 | * | 11/2010 | Noh ......................... 365/230.06 |
| 7,940,597 | B2 | * | 5/2011 | Kim ......................... 365/230.03 |
| 2005/0262405 | A1 | | 11/2005 | Cooper et al. |
| 2007/0147148 | A1 | * | 6/2007 | An ................................ 365/201 |
| 2009/0021993 | A1 | | 1/2009 | Nakazawa |
| 2009/0190411 | A1 | * | 7/2009 | Nakazawa et al. ........ 365/189.07 |
| 2011/0231717 | A1 | * | 9/2011 | Hur et al. ..................... 714/718 |

FOREIGN PATENT DOCUMENTS

| JP | 10-334699 | 12/1998 |
| JP | 2002-206173 | 7/2002 |
| KR | 1020080052047 A | 6/2008 |
| KR | 1020100030869 A | 3/2010 |

* cited by examiner

*Primary Examiner* — Son Mai
(74) *Attorney, Agent, or Firm* — William Park & Associates Ltd.

(57) ABSTRACT

A multi-bit test circuit for a semiconductor memory is configured to cause an active command to activate active signals. At least two active signals are respectively inputted to a plurality of banks at different timings in a multi-bit test mode.

18 Claims, 5 Drawing Sheets

MULTI-BIT TEST CIRCUIT OF SEMICONDUCTOR MEMORY APPARATUS

CROSS-REFERENCES TO RELATED APPLICATION

The present application claims priority under 35 U.S.C. §119(a) to Korean Patent Application No. 10-2010-0074022, filed on Jul. 30, 2010, in the Korean Intellectual Property Office, which is incorporated herein by reference in its entirety as if set forth in full.

BACKGROUND

1. Technical Field

The present invention relates to a semiconductor integrated circuit, and more particularly, to a multi-bit test circuit of a semiconductor apparatus.

2. Related Art

In the development and mass production of a semiconductor apparatus, various tests are performed for the semiconductor apparatus so as to verify the characteristics and functions of a product required in a specification, check performance of desired functions upon mounting and secure margins required in the specification, thereby improving the quality of the product.

In general, whether to pass or fail a product is determined based on the decision of a tester. That is to say, the tester generates control signals including a command, an address and a test data pattern in a sequence programmed by an engineer, applies the control signals to a product, and operates the product.

For example, address test data is written in a semiconductor apparatus, and data stored in the same address is read and outputted through a pad, so that whether to pass or fail a product is determined through comparing the data with a test pattern, the corresponding address is memorized, and an appropriate repair process may be performed for a failed address.

As a method of such a test, a multi-bit test or a parallel test is widely known in the art. In the multi-bit test, after a plurality of banks are simultaneously activated, read or write operations are performed so that a test time may be reduced. However, as the plurality of banks are simultaneously activated in the multi-bit test, a peak current markedly increases, and a fail is likely to occur due to noise caused by the peak current.

SUMMARY

Accordingly, there is a need for a multi-bit test circuit which may reduce a test time and decrease a peak current. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

In one embodiment of the present invention, a multi-bit test circuit for a semiconductor memory is configured to cause an active command to activate active signals, wherein at least two active signals are respectively inputted to a plurality of banks at different timings in a multi-bit test mode.

In another embodiment of the present invention, a multi-bit test circuit is configured to cause a read command to activate read signals, which are to be respectively inputted to a plurality of column addresses, at different timings in a multi-bit test mode.

In still another embodiment of the present invention, a multi-bit test circuit includes: a plurality of banks; and a multi-bit test circuit block configured to control input timings of active signals which are activated by an active command and input the active signals to corresponding banks among the plurality of banks in a multi-bit test mode.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
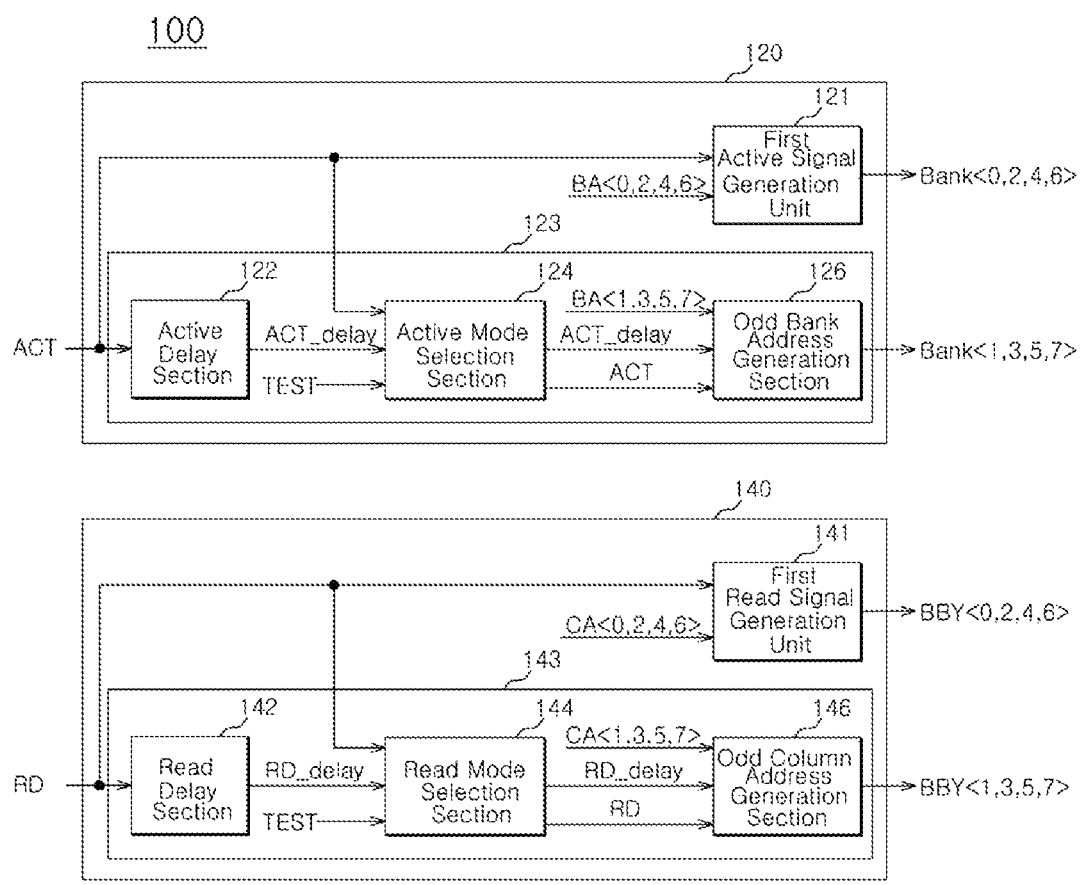
FIG. 1 is a block diagram schematically illustrating a multi-bit test circuit in accordance with an embodiment of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram schematically illustrating a multi-bit test circuit in accordance with an embodiment of the present invention.

Referring to FIG. 1, a multi-bit test circuit 100 in accordance with the embodiment includes a row-related address driving block 120 and a column-related address driving block 140.

The row-related address driving block 120 is configured to control input timings of active signals ACT which are to be respectively inputted to even banks and odd banks in a multi-bit test mode.

In detail, banks according to the present invention include first through eighth banks (not shown) each of which has a plurality of memory cells for storing data, and are divided into odd banks and even banks for power distribution.

In the present invention, in the multi-bit test mode, in order to reduce noise caused by a peak current abruptly increased by the active signals simultaneously inputted to all banks in the conventional art, banks are divided into the odd banks and the even banks such that active signals ACT with different timings may be inputted to the respective banks. In this regard, it is to be noted that the embodiment of the present invention is not limited to the division of banks into two groups and the banks may be divided into four groups depending on the embodiment.

In the multi-bit test mode, the row-related address driving block 120 may output even bank addresses BANK<0, 2, 4, 6> and odd bank addresses BANK<1, 3, 5, 7> in response to an active signal ACT and a delayed active signal ACT_delay, respectively, resulted from an active command. Thereafter, when repaired addresses are confirmed from the even and odd banks, signals with anti-fuse repair information of even and odd row addresses are enabled internally.

When the signals with the anti-fuse repair information of the even and odd row addresses are enabled, a read command is inputted to the column-related address driving block 140. Thereupon, the column-related address driving block 140 enables a read signal RD and a delayed read signal RD_delay to notify a read operation, and generates anti-fuse repair signals for corresponding column addresses, in response to the signals with the anti-fuse repair information of the row addresses.

At this time, the column-related address driving block 140 controls input timings of read signals RD which are to be respectively inputted to even column addresses BBY<0, 2, 4, 6> and odd column addresses BBY<1, 3, 5, 7>.

More specifically, the row-related address driving block 120 includes a first active signal generation unit 121 configured to input is the active signal ACT to the even banks, and a second active signal generation unit 123 configured to input the delayed active signal ACT_delay, acquired by delaying the active signal ACT by a predetermined time, to the odd banks.

The first active signal generation unit 121 generates the even bank address signals BANK<0, 2, 4, 6> through the combination of the active signal ACT and even bank enable signals BA<0, 2, 4, 6> for activating the even banks, and inputs the even bank address signals BANK<0, 2, 4, 6> to corresponding banks.

Figure 2:
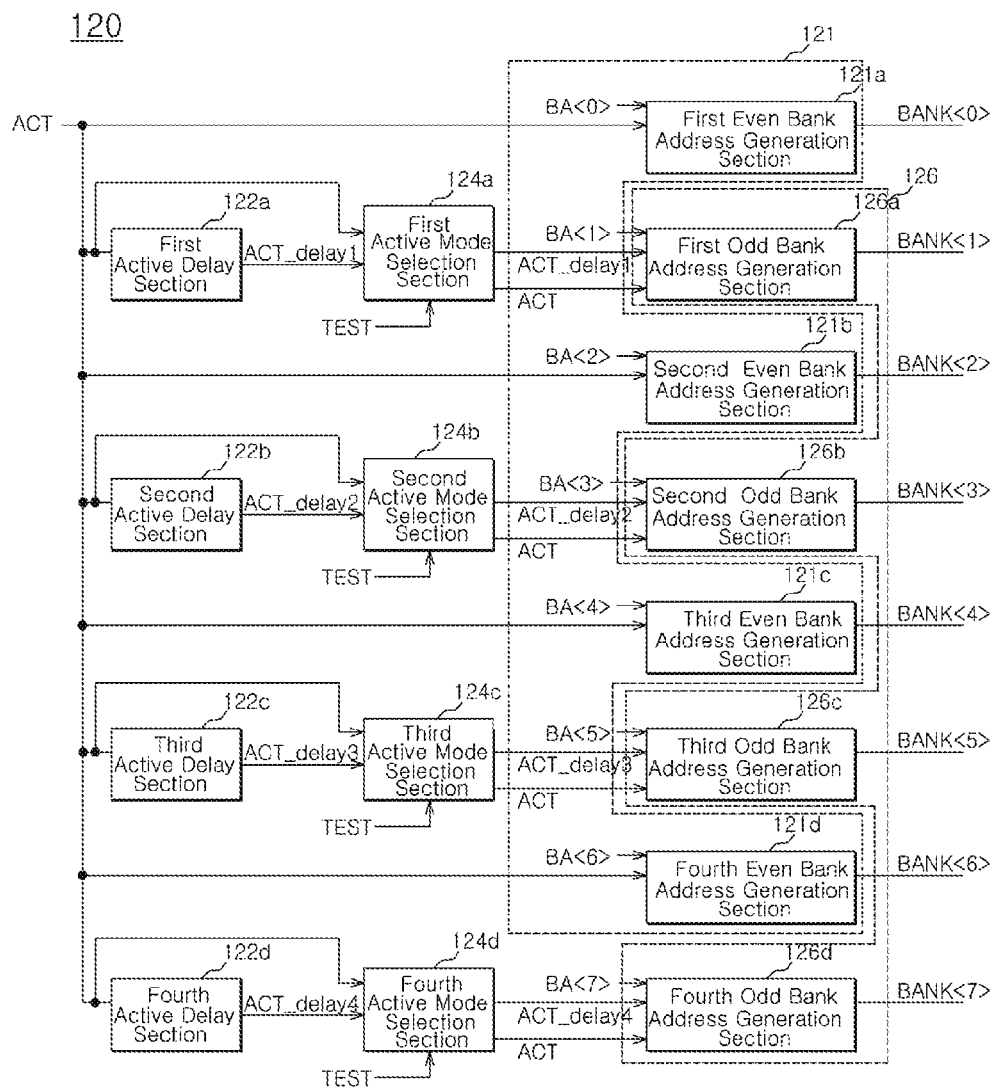
FIG. 2 is a block diagram illustrating in detail a row-related address driving block of the multi-bit test circuit in accordance with the embodiment of the present invention.

In detail, referring to FIG. 2, the first active signal generation unit 121 includes first through fourth even bank address generation sections 121a, 121b, 121c and 121d. The first through fourth even bank address generation sections 121a, 121b, 121c and 121d are configured to generate the even bank address signals BANK<0, 2, 4, 6> in response to the even bank enable signals BA<0, 2, 4, 6> for the even banks and the active signal ACT in the multi-bit test mode and a normal mode, and output the generated even bank address signals BANK<0, 2, 4, 6> to the even banks.

The second active signal generation unit 123 generates the odd bank address signals BANK<1, 3, 5, 7> by combining the active signal ACT or the delayed active signal ACT_delay with odd bank enable signals BA<1, 3, 5, 7> for activating the odd banks.

In detail, the second active signal generation unit 123 includes an active delay section 122, an active mode selection section 124, and an odd bank address generation section 126.

The active delay section 122 is configured to output the delayed active signal ACT_delay which is acquired by delaying the active signal ACT by the predetermined time. Referring to FIG. 2, the active delay section 122 includes first through fourth active delay sections 122a, 122b, 122c and 122d. The respective first through fourth active delay sections 122a, 122b, 122c and 122d are electrically coupled with corresponding odd banks and can input delayed active signals ACT_delay1, ACT_delay2, ACT_delay3 and ACT_delay4 to the corresponding odd banks BANK<1, 3, 5, 7>.

Figure 4:
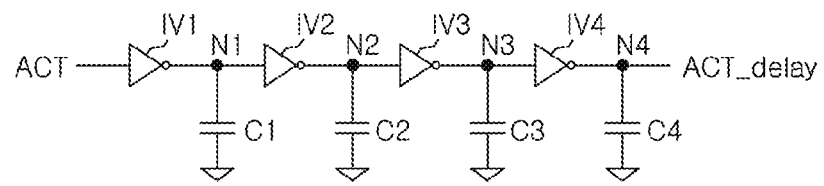
FIG. 4 is a circuit diagram illustrating in detail an active delay section of the row-related address driving block shown in FIG. 1.

Referring to FIG. 4, in the active delay section 122, four inverters IV1, IV2, IV3 and IV4 are coupled in series, and capacitors C1, C2, C3 and C4 are coupled to nodes N1, N2, N3 and N4 which are formed between the inverters IV1, IV2, IV3 and IV4. While it was described in the embodiment that the active delay section 122 is configured by coupling the four inverters IV1, IV2, IV3 and IV4, the present invention is not limited to such an embodiment, and it is conceivable that input timings of the active signals can be controlled by increasing or decreasing the number of inverters.

The active mode selection section 124 is configured to select and output any one of the delayed active signal ACT_delay inputted from the active delay section 122 or the active signal ACT inputted from an outside, in response to a test mod signal TEST.

In detail, referring to FIG. 2, the active mode selection section 124 includes first through fourth active mode selection sections 124a, 124b, 124c and 124d. Each of the first through fourth active mode selection sections 124a, 124b, 124c and 124d is configured to select any one of the delayed active signals ACT_delay1, ACT_delay2, ACT_delay3 and ACT_delay4 inputted from the first through fourth active delay sections 122a, 122b, 122c and 122d or the active signal ACT inputted from the outside, in response to the level of the test mode signal TEST, and output the selected signal to corresponding one of the odd bank address generation sections 126a, 126b, 126c and 126d.

Figure 5:
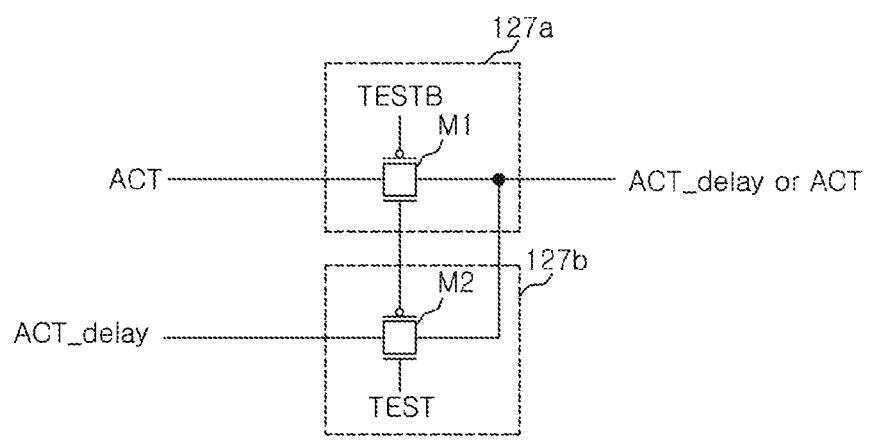
FIG. 5 is a circuit diagram illustrating in detail an active mode selection section of the row-related address driving block shown in FIG. 1.

In further detail, referring to FIG. 5, the active mode selection section 124 includes a first active mode selection part 127a configured to activate the active signal ACT inputted thereto, in response to the low level of the test mode signal TEST, and a second active mode selection part 127b configured to activate the delayed active signal ACT_delay in response to the high level of the test mode signal TEST.

In the embodiment of the present invention, the case in which the test mode signal TEST has the low level represents the normal mode, and the case in which the test mode signal TEST has the high level represents the multi-bit test mode. As shown in FIG. 5, in the embodiment of the present invention, the first and second active mode selection parts 127a and 127b employ transmission gates M1 and m2.

The odd bank address generation section 126 is configured to generate the odd bank addresses BANK<1, 3, 5, 7> in response to any one signal of the odd bank enable signals BA<1, 3, 5, 7> and the delayed active signal ACT_delay or the active signal ACT outputted from the active mode selection section 124.

In detail, referring to FIG. 2, the odd bank address generation section 126 includes first through fourth odd bank address generation sections 126a, 126b, 126c, and 126d. The first through fourth odd bank address generation sections 126a, 126b, 126c, and 126d are configured to generate first through fourth odd bank address signals BANK<1, 3, 5, 7> in response to any ones of the odd bank enable signals BA<1, 3, 5, 7> and the delayed active signals ACT_delay1, ACT_delay2, ACT_delay3 and ACT_delay4 or the active signals ACT outputted from the first through fourth active mode selection sections 124a, 124b, 124c and 124d.

The column-related address driving block 140 in accordance with the embodiment of the present invention includes a first read signal generation unit 141 configured to input read signals RD resulted from a read command to even column addresses (not shown), and a second read signal generation unit 143 configured to input a delayed RD signal RD_delay, acquired by delaying the read signal RD by a preselected time, to odd column addresses (not shown).

The first read signal generation unit 141 generates the even column address signals BBY<0, 2, 4, 6> through combining the read signal RD resulted from the read command and even column enable signals CA<0, 2, 4, 6> which have information of the even column addresses.

In detail, the first read signal generation unit 141 includes first through fourth even column address generation sections 141a, 141b, 141c and 141d. The first through fourth even column address generation sections 141a, 141b, 141c and 141d are configured to generate the even column address signals BBY<0, 2, 4, 6> by combining first through fourth even column enable signals CA<0, 2, 4, 6> and the read signal RD in the multi-bit test mode and the normal mode.

The second read signal generation unit 143 includes a read delay section 142, a read mode selection section 144, and an odd column address generation section 146.

The read delay section 142 is configured to output the delayed read signal RD_delay acquired by delaying the read signal RD by the preselected time.

Figure 3:
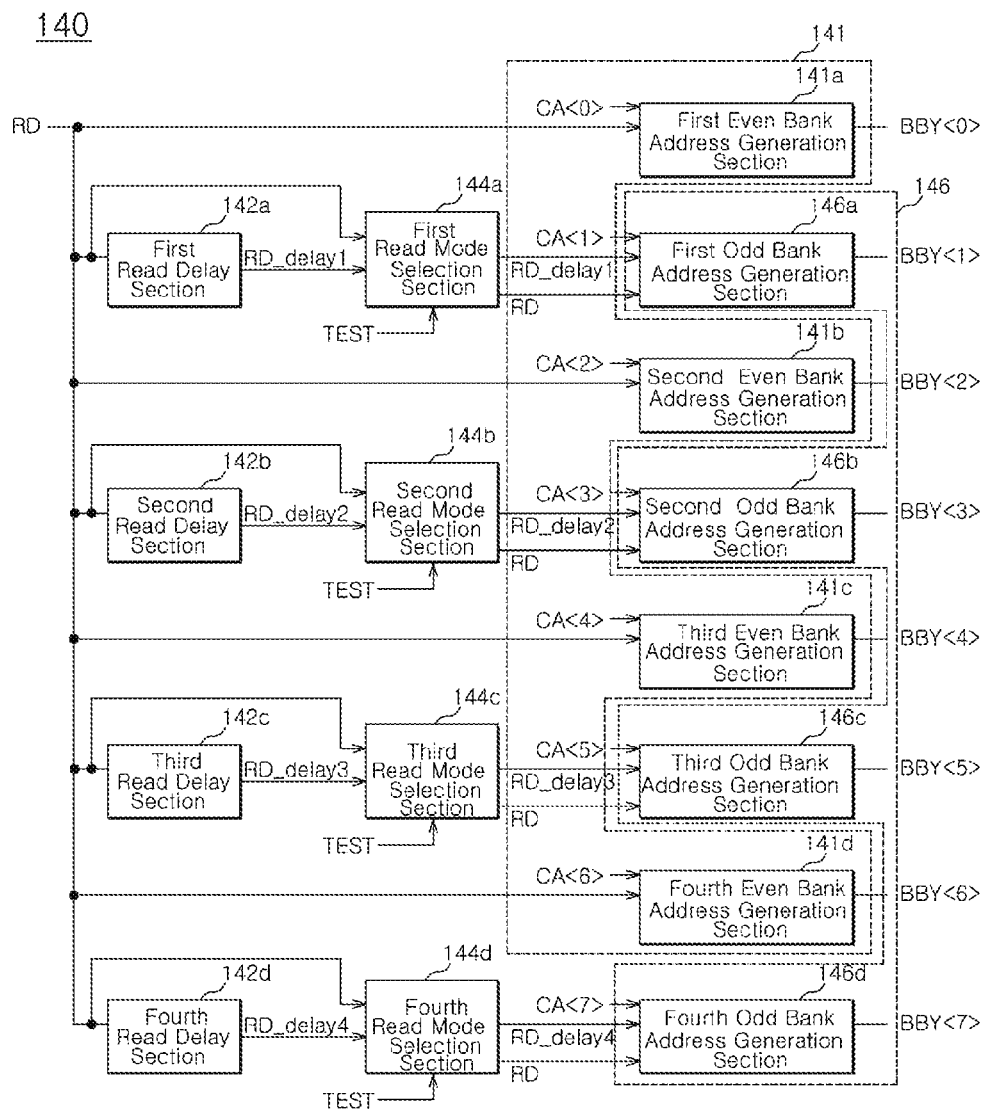
FIG. 3 is a block diagram illustrating in detail a column-related address driving block of the multi-bit test circuit in accordance with the embodiment of the present invention.

Referring to FIG. 3, the read delay section 142 includes first through fourth read delay sections 142a, 142b, 142c and 142d. The first through fourth read delay sections 142a, 142b, 142c and 142d are electrically connected with respective corresponding odd column addresses and can input the delayed read signal RD_delay to the corresponding odd column addresses. Since the read delay section 142 has the same configuration as the active delay section 122 shown in FIG. 4, detailed description thereof will be omitted herein.

The read mode selection section 144 is configured to select any one of the delayed read signal RD_delay inputted from the read delay section 142 or the read signal RD inputted from an outside, in response to the test mode signal TEST.

In detail, referring to FIG. 3, the read mode selection section 144 includes first through fourth read mode selection sections 144a, 144b, 144c and 144d. The first through fourth read mode selection sections 144a, 144b, 144c and 144d are configured to select any ones of delayed read signals RD_delay1, RD_delay2, RD_delay3 and RD_delay4 inputted from the first through fourth read delay sections 142a, 142b, 142c and 142d and the read signal RD inputted from the outside in response to the level of the test mode signal TEST, and output selected signals to corresponding odd column address generation sections 146a, 146b, 146c and 146d. Since the read mode selection section 144 has the same configuration as the active mode selection section 124 shown in FIG. 5, detailed description thereof will be omitted herein.

The odd column address generation sections 146a, 146b, 146c and 146d are configured to generate the odd column address signals BBY<1, 3, 5, 7> by combining odd column enable signals CA<1, 3, 5, 7> and the delayed read signal RD_delay or the read signal RD outputted from the read mode selection section 144.

In detail, referring to FIG. 3, the odd column address generation section 146 includes first through fourth odd column address generation sections 146a, 146b, 146c and 146d. The first through fourth odd column address generation sections 146a, 146b, 146c and 146d are configured to generate the odd column address signals BBY<1, 3, 5, 7> by combining the odd column enable signals CA<1, 3, 5, 7> and any ones of the delayed read signals RD_delay1, RD_delay2, RD_delay3 and RD_delay4 or the read signals RD outputted from the first through fourth read mode selection sections 144a, 144b, 144c and 144d.

In this way, the multi-bit test circuit according to the embodiment of the present invention can control timings of the active signals and read signals inputted to the even and odd banks, thereby reducing the noise caused by an abrupt increase in peak current.

Figure 6:
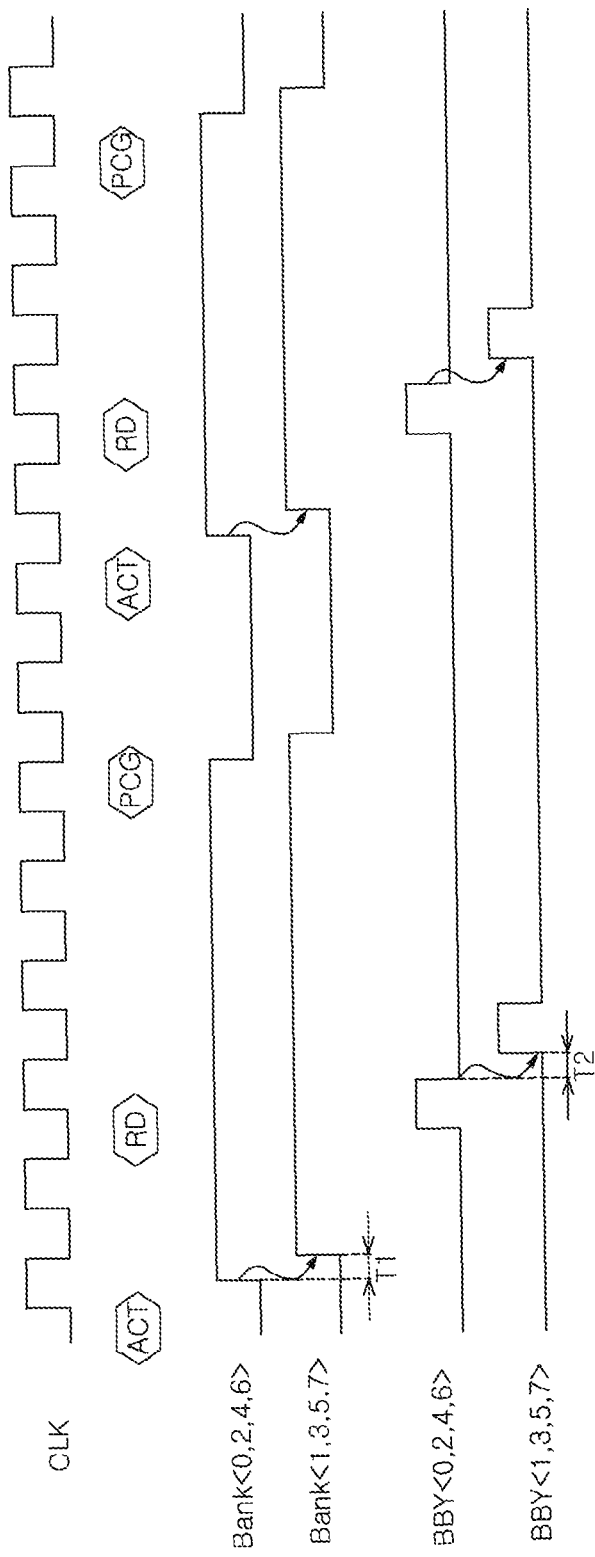
FIG. 6 is a timing diagram of the multi-bit test circuit in accordance with the embodiment of the present invention.

FIG. 6 is a timing diagram of the multi-bit test circuit in accordance with the embodiment of the present invention.

As a semiconductor apparatus enters a test mode during mass production, the test mode signal is enabled, and the active command is inputted according to row and column addresses of which repair states are to be checked.

The active signal and the delayed active signal which notify the active operation are generated by the active command, and at the same time, the even bank address signals BANK<0, 2, 4, 6> and the odd bank address signals BANK<1, 3, 5, 7> are sequentially enabled. At this time, the even bank address signals BANK<0, 2, 4, 6> and the odd bank address signals BANK<1, 3, 5, 7> have different timings in conformity with the active signal and the delayed active signal which have different timings. That is to say, the even bank address signals BANK<0, 2, 4, 6> are enabled earlier by the predetermined time of T1 than the odd bank address signals BANK<1, 3, 5, 7>.

The even bank address signals BANK<0, 2, 4, 6> and the odd bank address signals BANK<1, 3, 5, 7> maintain the enabled states until a precharge pulse signal is generated by a precharge command PCG.

The row addresses are inputted by the active command, and if repaired addresses are confirmed, signals with anti-fuse repair information of the row addresses are enabled internally.

Thereafter, as the read command is inputted, the read signal and the delayed read signal which have the preselected time difference of T2 are sequentially enabled to notify the read operation. Anti-fuse repair signals are generated from corresponding even column address signals BBY<0, 2, 4, 6> and the odd column address signals BBY<1, 3, 5, 7> which have the preselected time difference of T2, by the signals with the anti-fuse repair information of the row addresses.

While a certain embodiment has been described above, it will be understood to those skilled in the art that the embodiment described is by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A multi-bit test circuit for a semiconductor memory, which is configured to cause an active command to activate active signals, wherein at least two active signals are respectively inputted to a plurality of banks at different timings in a multi-bit test mode,
wherein the multi-bit test circuit comprises:
a first active signal generation unit configured to input the active signals to even banks; and
a second active signal generation unit configured to input delayed active signals acquired by delaying the active signals by a predetermined time, to odd banks
wherein the odd banks are activated when the predetermined time passes after the even banks are activated.

2. The multi-bit test circuit according to claim 1, wherein the first active signal generation unit comprises a plurality of even bank address generation sections configured to generate even bank address signals by combining the active signals and even bank enable signals.

3. The multi-bit test circuit according to claim 2, wherein the second active signal generation unit comprises:
an active delay section configured to output the delayed active signals acquired by delaying the active signals by the predetermined time;

an active mode selection section configured to select any one signals of the delayed active signals inputted from the active delay section and the active signals in response to a test mode signal; and an odd bank address generation section configured to generate odd bank address signals by combining the delayed active signals or the active signals outputted from the active mode selection section with odd bank enable signals.

4. The multi-bit test circuit according to claim 3, wherein the active mode selection section comprises:

a first active mode selection part configured to output the delayed active signals to the odd bank address generation section in response to a first level of the test mode signal in a test mode; and is a second active mode selection part configured to output the active signals to the odd bank address generation section in response to a second level of the test mode signal in a normal mode.

5. A multi-bit test circuit configured to cause a read command to activate read signals, which are to be respectively inputted to a plurality of column addresses, at different timings in a multi-bit test mode, wherein the multi-bit test circuit comprises:

a first read signal generation unit configured to input the read signals to even banks; and a second read signal generation unit configured to input delayed read signals acquired by delaying the read signals by a preselected time, to odd banks, wherein the delayed read signals are inputted the odd banks when the preselected time passes after the read signals are inputted the even banks.

6. The multi-bit test circuit according to claim 5, wherein the first read signal generation unit comprises a plurality of even column address generation sections configured to generate even column address signals by combining the read signals and even column enable signals.

7. The multi-bit test circuit according to claim 6, wherein the second read signal generation unit comprises:

a read delay section configured to output the delayed read signals acquired by delaying the read signals by the preselected time;

a read mode selection section configured to select any one signals of the delayed read signals inputted from the read delay section and the read signals in response to a test mode signal; and an odd column address generation section configured to generate odd column address signals by combining the delayed read signals or the read signals outputted from the read mode selection section with odd column enable signals.

8. The multi-bit test circuit according to claim 6, wherein the read mode selection section comprises:

a first read mode selection part configured to output the delayed read signals to the odd column address generation section in response to a first level of the test mode signal in a test mode; and a second read mode selection part configured to output the read signals to the odd column address generation section in response to a second level of the test mode signal in a normal mode.

9. A multi-bit test circuit comprising:

a plurality of banks; and a multi-bit test circuit block configured to control input timings of active signals which are activated by an active command and input the active signals to corresponding banks among the plurality of banks in a multi-bit test mode, wherein the multi-bit test circuit block comprises a row-related address driving block configured to input bank address signals, generated by delaying some active signals of the active signals by a predetermined time, to odd or even banks, wherein the odd banks are activated when the predetermined time passes after the even banks are activated.

10. The multi-bit test circuit according to claim 9, wherein the row-related address driving block comprises:

a first active signal generation unit configured to input the active signals to the even banks; and a second active signal generation unit configured to input delayed active signals acquired by delaying the active signals by the predetermined time, to the odd banks.

11. The multi-bit test circuit according to claim 10, wherein the first active signal generation unit comprises a plurality of even bank address generation sections configured to generate even bank address signals by combining the active signals and even bank enable signals.

12. The multi-bit test circuit according to claim 11, wherein the second active signal generation unit comprises:

an active delay section configured to output the delayed active signals acquired by delaying the active signals by the predetermined time;

an active mode selection section configured to select any one signals of the delayed active signals inputted from the active delay section and the active signals in response to a test mode signal; and an odd bank address generation section configured to generate odd bank address signals by combining the delayed active signals or the active signals outputted from the active mode selection section with odd bank enable signals.

13. The multi-bit test circuit according to claim 12, wherein the active mode selection section comprises:

a first active mode selection part configured to output the delayed active signals to the odd bank address generation section in response to a first level of the test mode signal in a test mode; and a second active mode selection part configured to output the active signals to the odd bank address generation section in response to a second level of the test mode signal in a normal mode.

14. The multi-bit test circuit according to claim 9, wherein the multi-bit test circuit block comprises a column-related address driving block configured to input column address signals, generated by delaying, by a preselected time, some read signals of read signals inputted from an outside at the same time with generation of the active signals, to column addresses.

15. The multi-bit test circuit according to claim 14, wherein the column-related address driving block comprises:

a first read signal generation unit configured to input the read signals to even column addresses; and a second read signal generation unit configured to input delayed read signals acquired by delaying the read signals by the preselected time, to odd column addresses.

16. The multi-bit test circuit according to claim 15, wherein the first read signal generation unit comprises a plurality of even column address generation sections configured to generate even column address signals by combining the read signals and even column enable signals.

17. The multi-bit test circuit according to claim 16, wherein the second read signal generation unit comprises:

a read delay section configured to output the delayed read signals acquired by delaying the read signals by the preselected time;

a read mode selection section configured to select any one signals of the delayed read signals inputted from the read delay section and the read signals in response to a test mode signal; and an odd column address generation section configured to generate odd column address signals by combining the delayed read signals or the read signals outputted from the read mode selection section with odd column enable signals.

18. The multi-bit test circuit according to claim 17, wherein the read mode selection section comprises:

a first read mode selection part configured to output the delayed read signals to the odd column address generation section in response to a first level of the test mode signal in a test mode; and a second read mode selection part configured to output the read signals to the odd column address generation section in response to a second level of the test mode signal in a normal mode.

\* \* \* \* \*